SOLDER METHOD FOR PROVIDING STANDOFF OF DEVICE FROM SUBSTRATE

Filed June 24, 1965

INVENTORS
JOHN NAPIER
RUPERT F. ROSS, JR.
BY David N. Koffsky
ATTORNEY

United States Patent Office 3,392,442

Patented July 16, 1968

3,392,442

SOLDER METHOD FOR PROVIDING STANDOFF OF DEVICE FROM SUBSTRATE

John Napier, Poughkeepsie, and Rupert F. Ross, Jr., Fishkill, N.Y., assignors to International Business Machines Corporation, Armonk, N.Y., a corporation of New York Filed June 24, 1965, Ser. No. 466,625
5 Claims. (Cl. 29—628)

ABSTRACT OF THE DISCLOSURE

A method for interconnecting semiconductor device contacts to connector lands in which the conductor lands include a lead-rich lead-tin solder having a high liquidus temperature and the semiconductor device contacts comprise lead-rich lead-tin solder having a liquidus temperature lower than that of the conductor land solder. For interconnection, the device contacts are placed on the conductor lands, and heated to a temperature above the solidus of the device contact solder but below the solidus of the conductor land solder whereby a solder bond is formed without melting the conductor lands.

This invention relates to a soldering method, and more particularly to a method for soldering a semiconductor body to a conductor structure.

Present-day microelectronic packaging techniques make wide use of chip-type transistors or semiconductors. These transistors are produced by the planar process and are arranged to have emitter, base and collector electrodes located in a single plane. When the transistor chip contacts are bonded to a conductor pattern, a number of interconnection requirements must be fulfilled before the resultant connection is acceptable. The interconnection must withstand normal shock, vibration, temperature and humidity extremes to which it will be subjected. Additionally, and more important, the interconnection must be of such a nature that it provides a standoff of the transistor chip from the underlying conductor pattern thereby preventing the occurrence of shorts or parasitics. Finally, the connecting materials should not produce a doping action on silicon or germanium which would tend to change the device characteristics.

A number of interconnection methods which provide the requisite interconnection characteristics have been proposed. One of these is disclosed in copending U.S. patent application 333,863 of Irwin M. Hymes entitled "Terminals for Micro Miniaturized Devices and Methods of Connecting Same," and now U.S. Patent No. 3,303,393. In the Hyme's method, a copper ball is utilized to connect each terminal of a planar transistor chip to a respective solder coated circuit land. When the transistor with its copper ball contacts is in place on the solder coated conductor pattern, the entire system is fired thereby causing the land solder to bond to the copper ball. The copper ball system, while providing an interconnection scheme which fulfills substantially all of the aforesaid requirements, does have the drawback that it provides a relatively rigid and inelastic contact. This fact gives rise to difficulties when the transistor chips undergo test since the impact of the test probes on the ball contacts is transmitted to the chip and can cause ruptures in the chip structure or other chip damage.

Accordingly, it is an object of this invention to provide a method for interconnecting a semiconductor to an underlying conductive land structure which is reproducible on a mass production basis.

It is a further object of this invention to provide a semiconductor-supporting conductive solder interconnection method which provides positive standoff of the semiconductor from the supporting conductor.

It is another object of this invention to provide a microminiaturized circuit element which may be joined to a microelectronic circuit and positively spaced from the circuit.

Still another object of this invention is to provide semiconductor chip interconnecting structures which elastically allow the chip to be probed during tests without undue injury thereto.

In accordance with the above stated objects, the conductor pattern to which the semiconductor chip is to be attached is provided with a coating of lead-rich, lead-tin solder that exhibits a relatively high liquidus temperature. A substantially hemispherical lead-tin solder mound is formed at each terminal area of the semiconductor chip, the mound being composed of sufficient lead to place its liquidus temperature on the lead-rich side of the eutectic but less than the liquidus temperature of the conductor pattern solder coat. The semiconductor terminal mounds are then placed in contact with a mating solder coated conductor structures and the entire configuration is heated above the eutectic temperature of the semiconductor chip mounds but below the conductor structures' solidus temperature. A cross-diffusion of lead and tin occurs between the mounds and conductor structures which causes the mounds to become lead-rich and to thereby solidify. While this action occurs, the mounds' surface tension maintains their shape thereby providing the required standoff for the semiconductor chip simultaneously with the production of the desired electrical and mechanical bond. A feature of this method is that the use of solder mound contacts negate the chip damage problem during testing since solder is a relatively soft and elastic material which can be probed without shock transmittal to the associated chip.

The foregoing and other objects, features and advantages of the invention will be apparent from the following more particular description of a preferred embodiment of the invention, as illustrated in the accompanying drawings.

Figure 1:
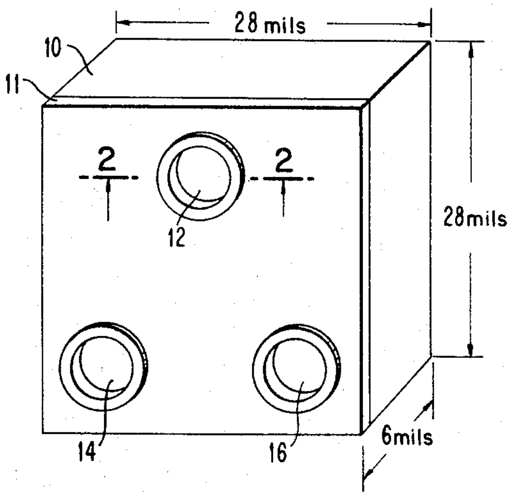
FIG. 1 is an isometric view of a semiconductor transistor chip before application of contact mounds.

Referring now to FIG. 1, semiconductor chip 10 is a transistor of the planar variety which has been provided with collector, base and emitter portions (not shown) through the operation of well-known diffusion processes. During the fabrication of chip 10, an aluminum land (not shown in FIG. 1) is deposited on each semiconductor region to provide the desired ohmic contact. Subsequent to the application of the aluminum lands, a layer of glass 11 is deposited over the surface of chip 10 to provide environmental protection. Holes 12, 14, and 16 are then etched in glass layer 11 directly over the aforesaid aluminum lands to expose them for subsequent metallization steps.

Figure 2:
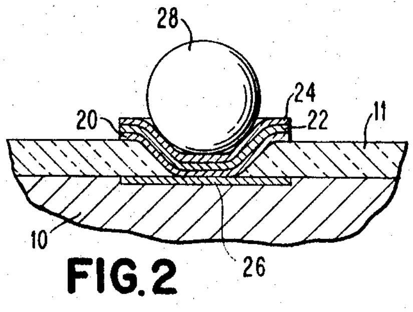
FIG. 2 is a sectional view taken along lines 2—2 in FIG. 1 of a representative contact area with a solder ball contact in place.

The respective layers of contact metallization at each of holes 12, 14, and 16 are shown in cross section in FIG. 2. Succeeding layers of chromium 20, copper 22, and gold 24 are vacuum deposited to provide desired electrical contact to aluminum land 26. Chromium deposit 20 establishes an excellent glass to metal seal and insures environmental protection of the contact area. The copper and gold deposits permit solderable metals to be adhered to chromium sealing film 20.

Subsequent to the above steps, a solder ball 28 is placed in contact with gold layer 24. Solder ball 28 is comprised of a solder alloy of tin and lead with a liquidus temperature which is on the lead-rich side of the eutectic but is low relative to other more lead-rich solders. It should be here mentioned that the conductor structure to which solder ball 28 is to be attached is coated with a lead-rich solder having a higher liquidus temperature. In the specific geometry shown in FIG. 2, the contact area has a diameter of approximately six mils and the solder ball has a diameter of approximately 5.5 mils. It is to be understood that while the described method of applying the low liquidus temperature solder to the contact areas is via the application of solder balls, other equally advantageous methods can be utilized. For instance, the semiconductor chip can be suitably masked and a relatively thick solder coat applied to the previously applied metallization layers. The thickness of such a solder coat may approximate 4–5 mils.

Figure 3:
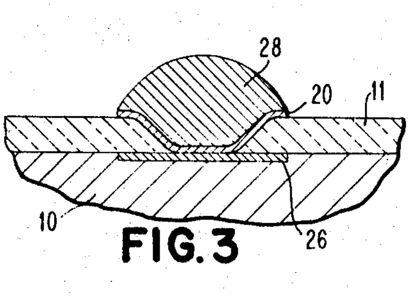
FIG. 3 is a view of the contact configuration of FIG. 2 after the contact ball has been reflowed.

After solder ball 28 or a vacuum deposited solder layer has been applied to the metalized contact areas, the entire chip 10 is fired to cause solder ball 28 to reflow and fill the entire contact area. The effect of this firing step on a contact area is shown in FIG. 3. Notice that solder ball 28 creates a substantially hemispherical mound due to the fact that the solder does not wet glass layer 11 and is thereby confined to the metalization area. The effect of this firing step also causes the copper and gold layers of metalization 22 and 24 to become absorbed into the solder mound leaving only chromium layer 20 distinctly outlined.

Figure 4:
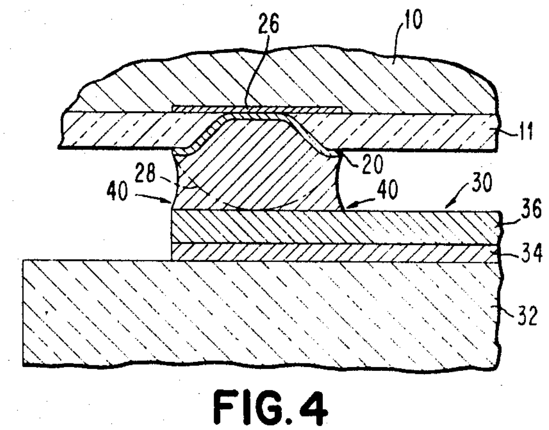
FIG. 4 is a sectional view of the completed connection.

Referring now to FIG. 4, chip 10 with its rigidly attached solder mounds 28 (shown in phantom) is inverted and placed in contact with a circuit structure 30 which is supported by ceramic or other insulating base 32. Circuit structure 30 comprises a silver-paladium or gold-platinum conductor 34 upon which has been deposited a layer of relatively high liquidus temperature solder 36. Solder 36 is of the lead-rich variety with a small percentage of tin included therein. The liquidus temperature of solder layer 36 is considerably higher than that of solder mound 28. The volume of solder layer 36 must also be greater than the volume of hemisphere 28 for reasons to be hereinafter more fully described.

Figure 5:
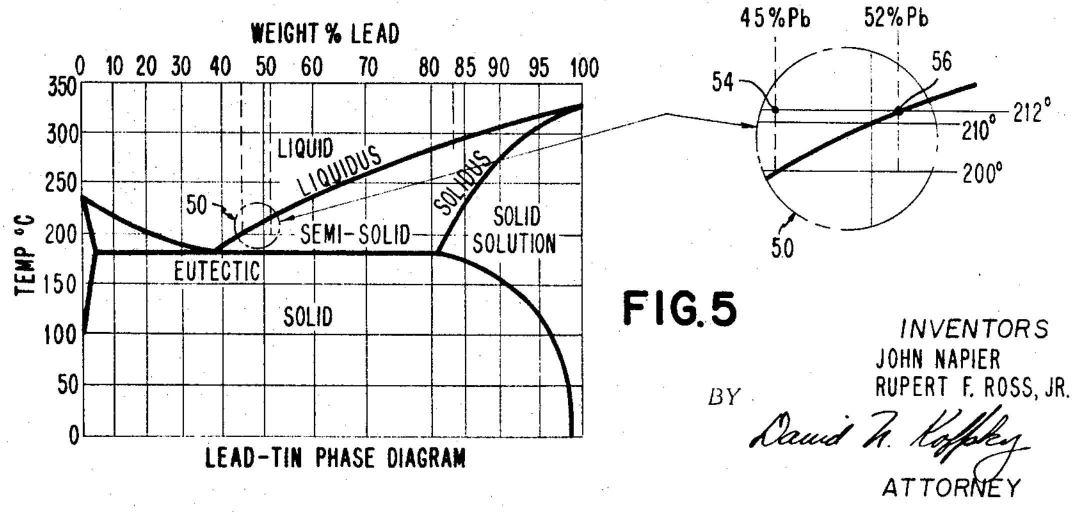
FIG. 5 is a lead-tin phase diagram useful in describing the invention.

Once semiconductor chip 10 and its associated solder mounds 28 are in place upon circuit structure 30, the entire system is pre-heated to a temperature somewhat below the liquidus temperature of either of the solder compositions. Then, the temperature is raised to a point slightly above the liquidus temperature of the solder mound 28. Referring to the phase diagram of FIG. 5, if it is assumed that solder mound 28 contains 45 percent by weight lead, the temperature must be raised to a point slightly above 200° C. to cause the mound to go into the liquid state. If it is further assumed that solder coating 36 contains 90 percent by weight lead, it can be seen that a temperature slightly above 200° C. falls within its solid solution phase. When the liquidus temperature of mound 28 is exceeded, the relative concentration gradients between mound 28 and solder coat 36 create a situation where cross-diffusion of the constituent components can take place. The lead from solder coat 36 begins to diffuse into solder mound 28 while the tin from solder mound 28 diffuses into solder coat 36. The diffusion of the lead into mound 28 raises its liquidus temperature while the diffusion of the tin into the coating causes the contact surface area to become tin-rich and in the liquid state. While this cross-diffusion takes place, the surface tension of solder mound 28 acts to maintain its original substantially hemispherical shape notwithstanding the weight of the semiconductor chip 10. After a perior of time however, the weight of the chip and the liquid state of the ball tends to cause the contact area between mound 28 and coating 36 to begin to expand. Along the outer edges 40 of the contact area, a very thin layer of mound solder 28 forms a "wave." Diffusion of lead from solder coat 36 into the wave area 40 causes it to become highly lead-rich and to solidify thereby creating a barrier which prevents further expansion of the contact area. The solidification process continues towards the center of mound 28, the time for this occurrence being basically controlled by the rate of diffusion of lead from coating 36 into solder mound 28. As the lead content of solder mound 28 increases, (after the initial edge freezing occurs) the entire mound freezes at the applied temperature. The system is then cooled and allowed to completely solidify thereby achieving the desired solder connection.

As can thus be seen, the utilization of the solder mound 28 provides both the desired strong electrical connection between semiconductor chip 10 and conductor land 30 while simultaneously maintaining a standoff distance between the chip and its supporting substrate. This thereby prevents any short circuits between the respective contact areas and allows potting material or other inert substances to completely encase the semiconductor system.

*Example 1.*—A transistor chip 0.28 inch square by .006 inch thick with three .006 inch diameter contact terminals on which solder mounds of 55 percent Sn—45 percent Pb, approximately .005 inch high have been formed is positioned on a conductor land containing 17 percent Sn and a83 Pb. (.015 inch wide by .002 inch high). A rosin flux is used both as a flux for the soldering operation and also as a loose adhesive to prevent relative movement between the semiconductor chip and the conductor lands. The assembly is then placed in a three zone furnace and preheated in the first zone to 160° C. in a suitable protective atmosphere. When the system has reached the preheated temperature, it is moved into a succeeding zone and held at 212° C. The action at this time can be appreciated by referring in FIG. 5 to the blown up section generally designated 50. As can be seen, at 160° C. the entire system is in the solid state. When it is moved into the hot zone at 212° C., the liquidus temperature of solder mound 28 is exceeded (point 54) and cross-diffusion begins between the solder land 36 and solder mound 28. When the composition of the solder mound reaches 52 percent Pb by weight, solder mound 28 begins to freeze at 212° C. (point 56). It was found that complete freezing occurred in three minutes, at which time the assembly was moved to a cool zone in the protective atmosphere, cooled to room temperature and then removed.

It has been found that it is not absolutely necessary that the liquidus temperature of solder mound 28 be exceeded but that a solder joint of similar physical characteristics can be obtained by exceeding only the solidus temperature of mound 28. Using this technique, however, the time required to allow complete diffusion and resultant freezing of the system becomes rather long as compared to the time required for freezing of the system when its liquidus temperature is exceeded.

The one requirement which must be met in regards to the volume of solder layer 36 is that it must contain sufficient lead to raise the fusion point of solder mound 28 above the operating temperature of the soldering system. It should further be noted, that the actual soldering temperature cannot be allowed to exceed the liquidus temperature of solder mound 28 by any great amount since this, in effect, defers the edge freezing effect described above. In other words, the higher the temperature, the greater the concentration of lead is required along edge area 40 before the edge freezing occurs. The higher the lead content, the longer this condition takes to occur with a resultant widening of the contact area between mound 28 and solder land 36. This effect essentially reduces the standoff distance between chip 10 and conductor land 30 and may, if the temperature is too high, completely negate the standoff feature of this invention.

While the invention has been particularly shown and described with reference to a preferred embodiment thereof, it will be understood by those skilled in the art that changes in form and details may be made therein without departing from the spirit and scope of the invention.

We claim:

1. A method for soldering the terminal areas of a semiconductor body to supporting conductor structures, each said structure composed of a lead-rich, lead-tin solder which exhibits a high liquidus temperature, the method comprising the steps of:
forming a substantially hemispherical lead-tin solder mound at each terminal area, said mounds composed of sufficient lead to place their liquidus temperature on the lead-rich side of the eutectic but less than the liquidus temperature of said conductor structures;
placing each said formed mound in contact with a mating conductor structure;
heating said mounds and conductor structures above the eutectic temperature of said mounds but below the solidus temperature of said conductor structures, the surface tension of said mounds acting to substantially maintain their shape and prevent their collapse until a cross migration of lead into said mounds from said structures causes said mounds to freeze and provide high strength solder connections.

2. A method for soldering the terminal areas of a semiconductor body to supporting conductor structures, each said structure composed of a lead-rich, lead-tin solder which exhibits a high liquidus temperature, the method comprising the steps of:
forming a substantially hemispherical lead-tin solder mound at each terminal area, said mounds composed of sufficient lead to place their liquidus temperature on the lead-rich side of the eutectic but less than the liquidus temperature of said conductor structures;
placing each said formed mound in contact with a mating conductor structure;
heating said mounds and conductor structures above the liquidus temperature of said mounds but below the solidus temperature of said conductor structure, the surface tension of said mounds acting to substantially maintain their shape and prevent their collapse until a cross-migration of lead into said mounds from said structures causes said mounds to freeze and provide high strength solder connections.

3. The method of claim 2 wherein said heating step takes said mound and conductor structure to a temperature above the liquidus of said mounds, said temperature being sufficiently near the liquidus temperature of said mounds to allow freezing of the edges of the contact areas before the surface tension of said mounds is overcome by the weight of said semiconductor body.

4. A method for soldering the terminal areas of a planar semiconductor body to supporting conductor structures, each said structure composed of a lead-rich, lead-tin solder which exhibits a high liquidus temperature, the method comprising the steps of:
placing a lead-tin solder ball at each terminal area, said solder balls having sufficient lead to place their liquidus temperature on the lead-rich side of the eutectic but less than the liquidus temperature of said conductor structures;
heating said solder balls to cause them to reflow and become hemispherical mounds;
placing each said formed mound in contact with a mating conductor structure;
heating said mounds and conductor structures above the liquidus temperature of said mounds but below the solidus temperature of said conductor structures, the surface tension of said mounds acting to substantially maintain their shape and prevent their collapse until a cross-migration of lead into said mounds from said structures causes said mounds to freeze and provide high strength solder connections.

5. A method for soldering the terminal areas of a planar transistor chip to supporting conductor structures, each said structure including a lead-rich, lead-tin solder which exhibits a high liquidus temperature, the method comprising the steps of:
depositing a lead-tin solder layer at each terminal area, said layers composed of sufficient lead to place their liquidus temperature on the lead-rich side of the eutectic but less than the liquidus temperature of said conductor structures;
heating said layers to cause them to reflow and assume substantially hemispherical mound configurations;
placing each said formed mound in contact with a mating conductor structure;
heating said mounds and conductor structures above the liquidus temperature of said mounds but below the solidus temperature of said conductor structures, the surface tension of said mounds acting to substantially maintain their shape and prevent their collapse until a cross-migration of lead into said mounds from said structures causes said mounds to freeze and provide high strength solder connections.

References Cited

UNITED STATES PATENTS

| | | | |
|---|---|---|---|
| 3,046,651 | 7/1962 | Olmon | 29—498 |
| 3,292,240 | 12/1966 | McNutt | 29—504 X |
| 3,303,393 | 2/1967 | Hymes. | |

CHARLIE T. MOON, *Primary Examiner.*

R. F. DROPKIN, *Assistant Examiner.*